United States Patent [19]

Harper et al.

[11] Patent Number: 5,438,270
[45] Date of Patent: Aug. 1, 1995

[54] LOW BATTERY TESTER COMPARING LOAD AND NO-LOAD BATTERY VOLTAGE

[75] Inventors: Jonathan P. Harper; Hubert Utz, both of Munich, Germany

[73] Assignee: National Semiconductor Corporation, Santa Clara, Calif.

[21] Appl. No.: 265,531

[22] Filed: Jun. 24, 1994

[51] Int. Cl.$^6$ .................. G01N 27/416; H02J 7/04
[52] U.S. Cl. .................. 324/429; 320/48; 324/433
[58] Field of Search .......... 324/427, 429, 433; 340/636; 320/48; 307/28, 29, 38, 66

[56] References Cited

U.S. PATENT DOCUMENTS

| | | |
|---|---|---|
| 3,564,287 | 2/1971 | Todd . |
| 4,037,194 | 7/1977 | Boyden .................. 340/636 |
| 4,338,596 | 7/1987 | Huber et al. .............. 340/636 |
| 4,520,353 | 5/1985 | McAuliffe ................ 324/429 |
| 4,602,253 | 7/1986 | Kreft . |
| 4,665,370 | 5/1987 | Holland ................... 324/429 |
| 4,703,203 | 10/1987 | Gallup et al. . |
| 4,816,768 | 3/1989 | Champlin ................ 340/636 |
| 4,967,102 | 10/1990 | Mahler . |
| 4,985,645 | 1/1991 | Tsutzui . |
| 5,006,732 | 4/1991 | Nakamura . |
| 5,034,623 | 7/1991 | McAdams . |
| 5,047,669 | 9/1991 | Iwamura et al. . |
| 5,047,751 | 9/1991 | Miura et al. . |
| 5,066,874 | 11/1991 | Koya . |
| 5,095,308 | 3/1992 | Hewitt . |
| 5,122,751 | 6/1992 | Aita et al. ................ 324/429 |
| 5,132,566 | 7/1992 | Denda . |
| 5,138,195 | 8/1992 | Satou et al. . |
| 5,140,269 | 8/1992 | Champlin ................ 320/48 |
| 5,148,158 | 9/1992 | Shah . |
| 5,184,023 | 2/1993 | Carlo et al. . |
| 5,191,228 | 3/1993 | Sloan . |
| 5,238,184 | 8/1993 | Adams . |

Primary Examiner—Maura K. Regan
Attorney, Agent, or Firm—H. Donald Nelson; Ken J. Koestner; Richard J. Roddy

[57] ABSTRACT

A test circuit (200) furnishes a low battery level signal on the basis of a comparison between a first ratio of the battery potential when the battery (206) is unloaded and a second ratio of the loaded battery potential. The battery test circuit includes a potential divider (210), a comparator (250) and a potential sampler including a storage element (240), a controller (260), a control line (266) and a switch (268). The potential divider is coupled to the battery and includes a first tap (226) and a second tap (224). The potential sampler, which includes a storage element (240), is coupled to the first tap through a switch (268) so that a first ratiometric portion of the unloaded battery voltage is stored on the storage element. The comparator has a first input that is coupled to the storage element and a second input that is coupled to the second tap. The comparator compares the first ratiometric portion of the unloaded battery voltage to a second ratiometric portion of the loaded battery voltage and generates an output (234), which designates a battery test result, on the basis of the comparison.

16 Claims, 4 Drawing Sheets

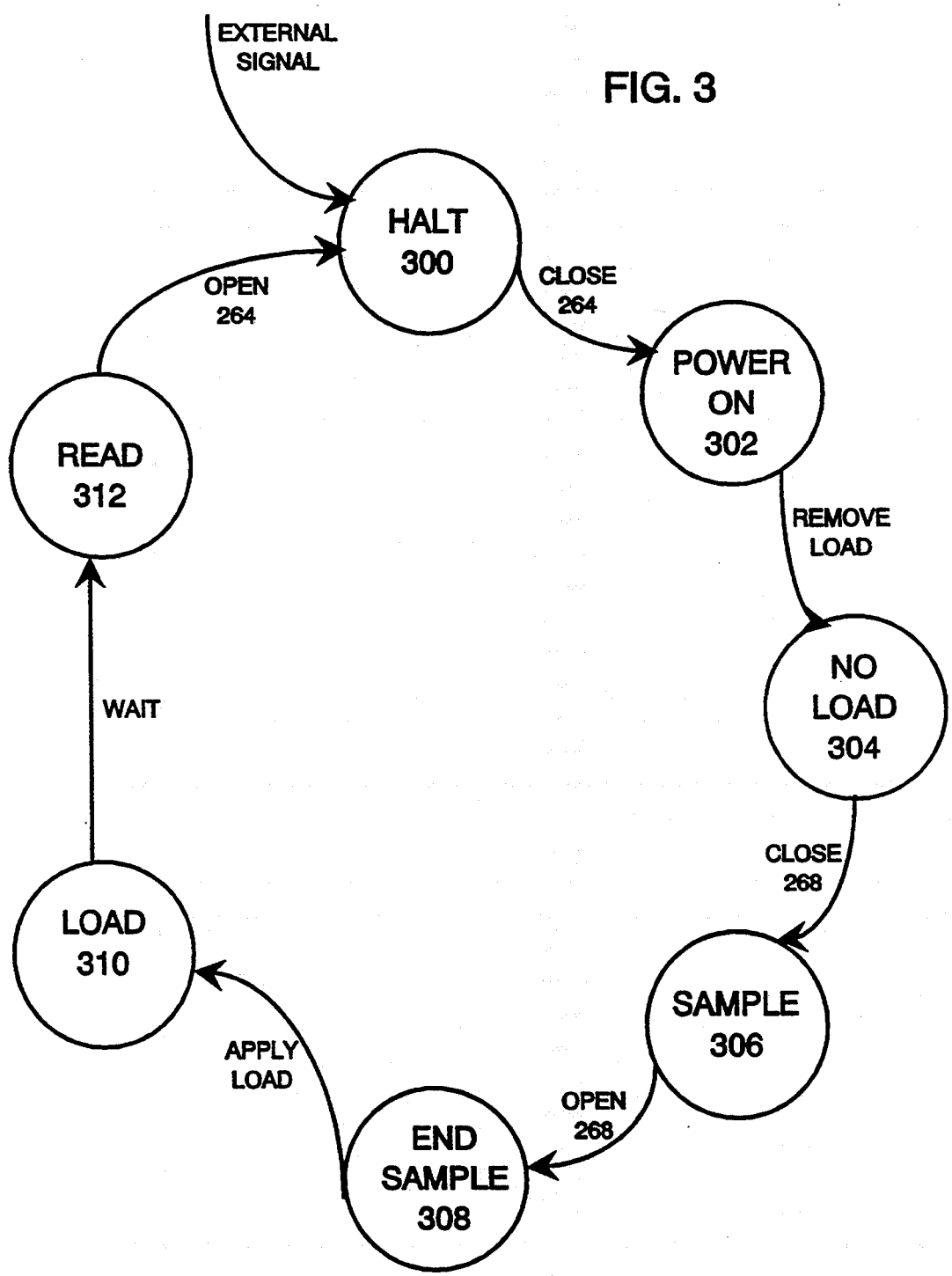

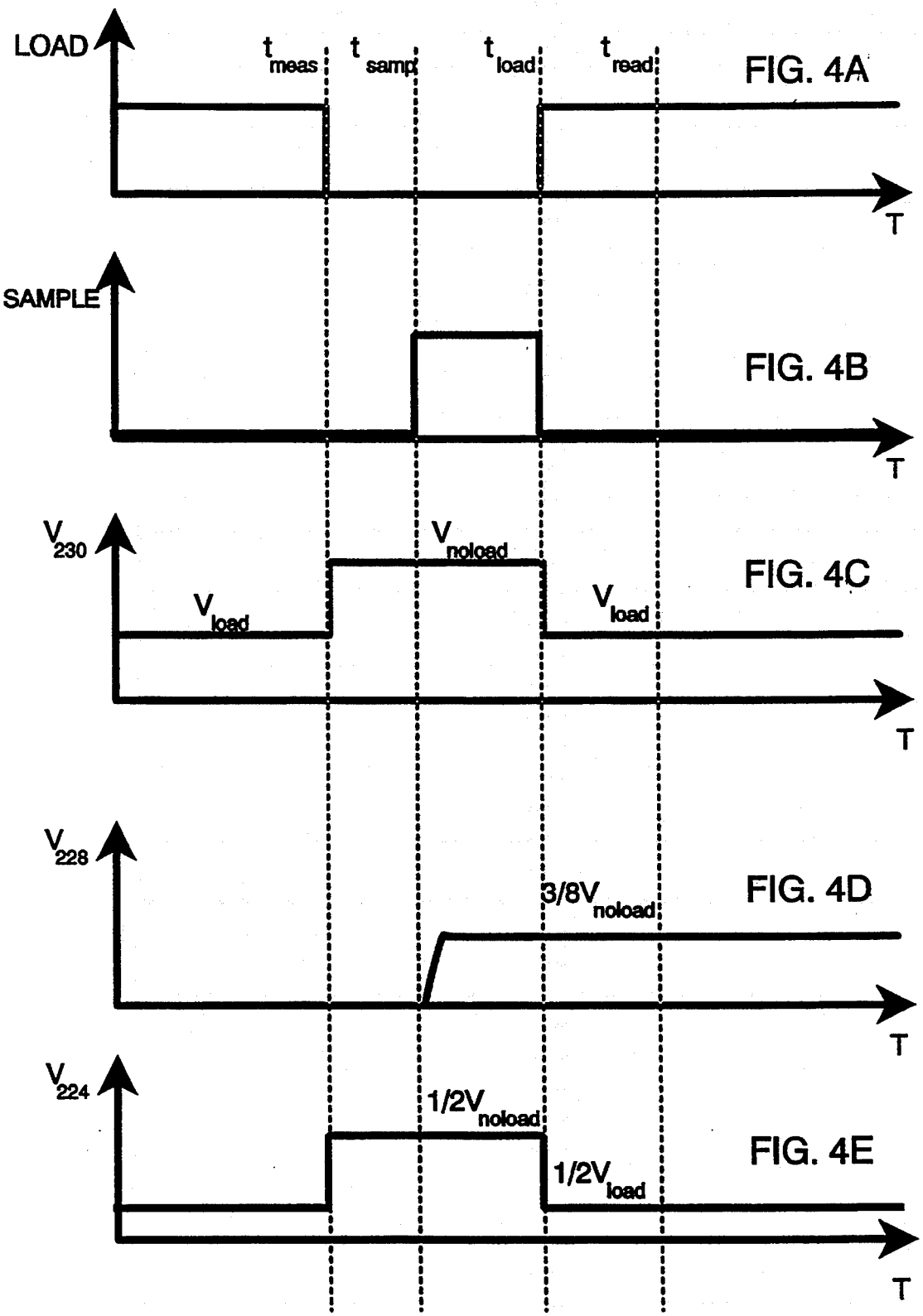

LOW BATTERY TESTER COMPARING LOAD AND NO-LOAD BATTERY VOLTAGE

BACKGROUND OF THE INVENTION

1. Field of the Invention

The present invention relates to a battery test circuit and, more particularly, to a battery test circuit that gauges battery condition on the basis of a relative change in potential when a load is applied to the battery.

2. Description of the Related Art

A battery level tester is useful in various battery-powered electronic applications for testing charge on a battery and informing a user of the battery voltage level. For example, the battery level tester may be used in a battery level indicator to warn when failure of the battery is impending. The battery level tester may also be used in a battery charger controller to determine whether a battery is charged, thereby preventing overcharging and damaging of the battery.

One technique for battery level testing is accomplished by the apparatus shown in FIG. 1, which includes a comparator 150, a voltage divider 110 connected to receive a battery voltage Vcc and a reference generator 140. The voltage divider 110 includes two resistors 112 and 114, connected in series. A node 124 between the resistors furnishes a tap line for accessing a divided voltage. The battery voltage Vcc is applied to the voltage divider 110 and the node 124 connects a divided voltage line 120 to one input terminal, the inverting input, of the comparator 150. The other comparator terminal, the noninverting input, receives the reference voltage from the reference generator 140 on line 122 so that, when the battery is low and the divided voltage $[V_d]$ on line 120 is less than the reference voltage $[V_{ref}]$ on line 122, the comparator output 134 goes high, indicating an impending battery failure. One problem with this technique is that a stable reference generator is difficult, and relatively expensive, to implement in silicon. Another problem with this technique is that components, for example resistors (112 and 114), in the voltage divider have fixed impedance values so that it is only practical for testing batteries of a single nominal voltage. It is desirable to apply the battery level indicator regardless of the voltage of the battery. For example, it is useful to apply a battery level indicator for usage in testing both 5 volt and 3 volt batteries, as well as batteries of other voltages. One solution to this problem is to replace the reference generator on the chip with an external pin to supply the reference voltage. However, the external pin and additional external resistors disadvantageously increase the size and cost of the battery level indicator.

An additional implementation of a battery level indicator employs an analog to digital converter and a reference generator for testing the battery level. This approach is disadvantageously expensive for many applications.

What is desired is an inexpensive battery level indicator for implementation in silicon that is useful for testing batteries of various nominal voltages.

SUMMARY OF THE INVENTION

In accordance with a first embodiment of the present invention, a test circuit furnishes a low battery level signal on the basis of a comparison between a first ratio of the battery potential when the battery is unloaded and a second ratio of the loaded battery potential. The battery test circuit includes a potential divider, a potential sampler and a comparator. The potential divider is coupled to the battery and includes a first tap and a second tap. The potential sampler, which includes a storage element, is coupled to the first tap through a switch so that a first ratiometric portion of the unloaded battery voltage is stored on the storage element. The comparator has a first input that is coupled to the storage element and a second input that is coupled to the second tap. The comparator compares the first ratiometric portion of the unloaded battery voltage to a second ratiometric portion of the loaded battery voltage and generates an output, which designates a battery test result, on the basis of the comparison.

In accordance with a second embodiment of the present invention, a method of detecting a low battery condition includes the steps of dividing the battery voltage into first and second ratiometric potentials when the battery is unloaded and storing the first ratiometric potential of the unloaded battery. The method further includes the steps of applying a load to the battery, dividing the loaded battery voltage into first and second ratiometric potentials and comparing the stored first ratiometric potential of the unloaded battery to the second ratiometric potential of the loaded battery. A low battery voltage is detected when the first ratiometric potential of the unloaded battery is greater than the second ratiometric potential of the loaded battery.

The described embodiments of a battery level detector furnish numerous advantages. For example, a low battery charge condition is detected by measuring a relative change in battery potential under load and observing a significant drop in potential as compared to the no-load battery potential when the battery is low. Thus no reference voltage generator or external pins for delivering a reference voltage are required. Furthermore, one circuit with a fixed set of impedances in the potential divider network is applicable for test the battery level of different batteries supplying a wide range of voltages. Since only relative voltages are tested, rather than absolute voltage levels, the same battery voltage tester is applied to test different batteries having different nominal voltages. This advantage is accomplished regardless of the relative resistances selected for implementation.

Also advantageously, the illustrative battery voltage tester does not require a stable reference voltage generator and instead requires only inexpensive components, including resistors, transmission gates and a capacitor.

BRIEF DESCRIPTION OF THE DRAWINGS

The present invention is better understood and its advantages, objects and features made better apparent by making reference to the following description, taken in conjunction with the accompanying drawings, wherein:

FIG. 3 is a state diagram that depicts a control procedure for testing the battery voltage using the battery test circuit shown in FIG. 2; and FIG. 4 is a timing diagram which illustrates the procedure for testing battery potential in accordance with the state diagram of FIG. 3.

DETAILED DESCRIPTION OF THE PREFERRED EMBODIMENTS

Figure 1:
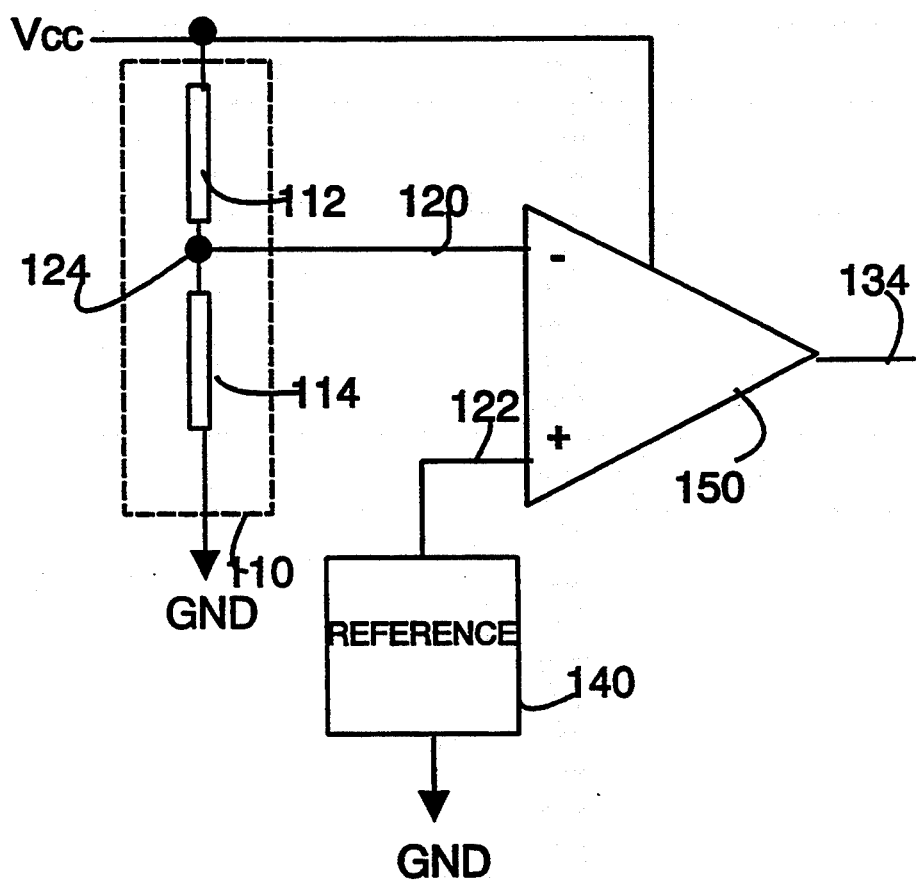
FIG. 1 is a schematic block diagram of a conventional battery test circuit.
Figure 2:
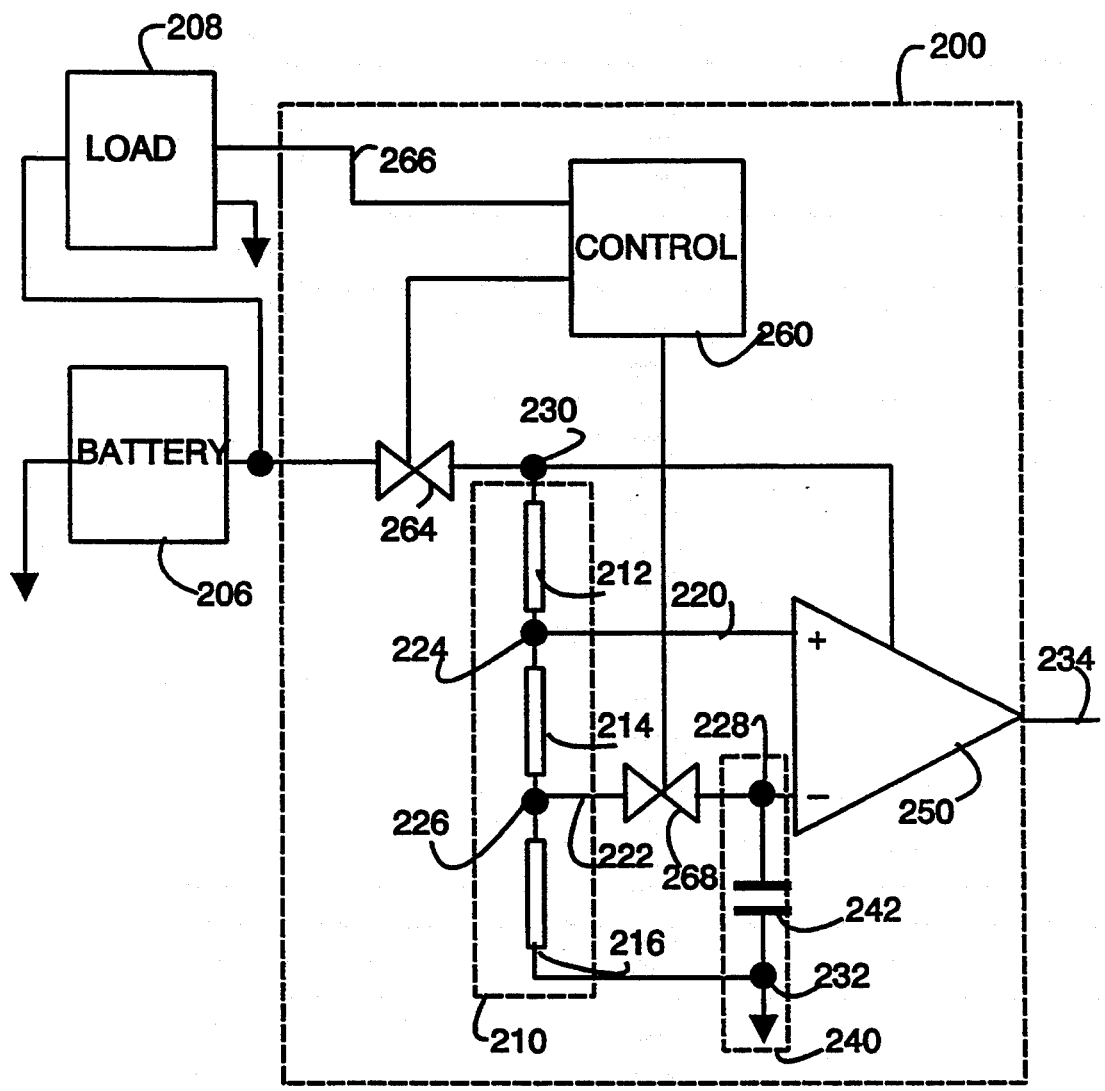
FIG. 2 is a schematic block diagram of an embodiment of the battery test circuit of the present invention.

Referring to FIG. 2, a battery voltage tester 200 is connected to a battery 206 through a first switch 264 at a battery node 230. A load 208 is applied to the battery 206 under the control of a control line 266 which switches the load 208 between a low-power condition and a high-power condition. The battery voltage tester 200 includes a potential divider 210 that connects to the battery node 230. The potential divider 210 is a chain of resistors arranged in series. The chain is tapped at multiple positions to furnish access to various fractions of the total voltage across the chain. The potential divider includes a first resistor 212, a second resistor 214 and a third resistor 216. The first resistor 212 is connected to the battery node 230 at one end and connected to the second resistor at a first node 224 at its opposite end. The second resistor 214 is also connected to the third resistor 216 at a second node 226 opposite the first node 224. The third resistor 216 is also connected to a reference node 232 opposite resistor 216 from the second node 226. Ratiometric potentials are sampled from the potential divider 210 on a first tap 220 located at the first node 224 and on a second tap 222 located at the second node 226. In the illustrated embodiment the first resistor 212, second resistor and third resistor 216 have respective resistances of $4R_x$, $R_x$ and $3R_x$, where $R_x$ is a selected resistance value. In one embodiment, the resistance values range from the tens to hundreds of kohms. The matching of resistor values is more important than the absolute resistance values.

Using these exemplary relative resistances, the battery voltage tester 200 actuates a low battery signal output 234 if the battery 206 voltage drops by more than 25 percent when the load 208 is applied to the battery 206. These relative resistance values are presented only to explain the operation of the battery voltage tester 200. In practice, other ratios of relative resistance values may be selected.

A storage element 240 is included to furnish a stored potential which is used as a reference potential for testing the battery 206. The storage element 240 includes a capacitor 242 which is connected in parallel with the third resistor 216 of the potential divider 210. A second switch 268 is included to connect and disconnect the third resistor 216 and the capacitor 242. One side of the second switch 268 is connected to the second tap 222 of the potential divider 210 at the second node 226. The opposite side of the second switch 268 is connected at a third node 228 to the capacitor 242. The capacitor 242 is connected between the second switch 268 and the reference node 232. In one embodiment, the capacitance values of the capacitor 242 ranges from approximately 100 pF to 1 nF.

A comparator 250 furnishes testing of the battery voltage and generates the low battery signal output 234. The comparator 250 is connected at its noninverting input terminal to the first tap 220 of the potential divider 210 at the first node 224. The inverting input terminal of the comparator 250 is connected to the capacitor 242 and the second switch 268 at the third node 228.

A sampling controller 260 controls a measurement by operating the first switch 264 and the second switch 268, each of which is implemented as a CMOS transmission gate. In addition, the sampling controller 260 applies control signals to the control line 266 which switches the load 208 between a low-power condition and a high-power condition using a halt switch (not shown). The sampling controller 260 is any suitable control circuit that actuates switches and control lines at a prescribed time. For example, the sampling controller 260 may be a control logic circuit, a controller, a microprocessor or the like. The first switch 264 controls coupling between the battery 206 and the battery voltage tester 200. The control line 266 regulates loading of the battery 206. The second switch 268 manages the connection of the potential divider 210 to the capacitor 242.

Operation of the battery voltage tester 200 is described with reference to the state diagram of FIG. 3 relating to FIGS. 4A, 4B, 4C, 4D and 4E, which respectively depict timing diagrams for the LOAD (266) logic signal, the SAMPLE switch (268) logic signal, voltage signal $V_{230}$ at the battery node 230, voltage signal $V_{228}$ at the third node 228 and voltage signal $V_{224}$ at the first node 224.

Sampling controller 260 implements the steps of a control procedure for measuring the battery voltage according to the state diagram shown in FIG. 3. Generally, the battery voltage is not under test so that the standard state of the battery voltage tester 200 is a halt state 300 which the sampling controller 260 enters by opening switch 264. During the halt state 300, depending on the application and device in which the tester 200 is used, the sampling controller 260 generally operates the control line 266 to generate the LOAD logic signal, which applies the load 208 to the battery 206.

A battery test is actuated, at time $t_{meas}$, when the tester 200 is in the halt state by receipt of an external signal, for example by pressing a button (not shown), which requests a battery voltage test. The controller 260 closes switch 264 to enter a power-on state 302 and apply power to the comparator 250. Tester 200 is placed in a no load state 304 when sampling controller 260 regulates the control line 266 to place the load 208 in a low power condition so that the voltage at the battery node 230 changes from $V_{load}$ to $V_{noload}$. The second switch 268 controls connection and disconnection of the capacitor a 242 from the second tap 222 of the potential divider 210. During the no load state 304, while the load 208 is removed from the battery 206, the sampling controller 260 closes the second switch 268 at time sample to place tester 200 in a sample state 306 and to sample the divided potential $\frac{3}{8}V_{noload}$ on the second tap 222 (at the second node 226) onto the capacitor 242 prior to application of the battery load 208. The sampling controller 260 controls the duration of the sample state. After a suitable sample time, sampling controller 260 places the tester 200 in an end sample state 308 by opening switch 268, disconnecting the noninverting terminal of the comparator 250 from the second tap 222, thus isolating storage element 240 from the battery 206, and applying the sampled potential $\frac{3}{8}V_{noload}$ to the noninverting terminal. Shortly thereafter, sampling controller 260 establishes tester 200 in a load state 310 by regulating the control signal 266 to place the load 208 in a high-power condition, applying the load 208 to the battery 206 at time $t_{load}$ and dropping the voltage at the battery node 230 to $V_{load}$. In load state 310, sampling controller 260 waits a predetermined settling time prior to reading the voltage measurement from comparator 250. When the settling time expires, sampling controller 260 enters a read state 312, during which the measurement result is accessed. The divided potential on the first tap 220, measured at the first node 224, becomes $\frac{1}{2}V_{load}$, which is applied to the inverting terminal of the comparator 250 If the potential applied to the inverting terminal of the comparator 250 ($\frac{1}{2}V_{load}$), is less than the potential applied to the noninverting terminal ($\frac{3}{8}V_{no-load}$), the low battery signal output 234 from the comparator 250 goes high, indicating a battery voltage drop of more than 25 percent due to the application of the load 208 to the battery 206. At time $t_{read}$, the low battery signal output 234 is read by logic (not shown) in an external circuit (not shown) soon after the battery 206 is loaded. The time $t_{read}$ is extended sufficiently to allow settling of the comparator 250 while being limited so that capacitor and gate leakage do not greatly reduce the measured voltages. Following read state 312, sampling controller 260 establishes the halt state 300 by opening first switch 264. The first switch 264 is furnished to disconnect the battery voltage tester 200 from the battery 206 when the battery voltage tester 200 is in halt mode 300 during times when the battery potential is not measured. The first switch 264, when open, powers down the comparator 250 and potential divider 210. In many applications of the battery voltage tester 200, including electronic key and battery-powered cordless telephone applications, the battery 206 is small. Switch 264, under control of controller 260, is useful for disconnecting the battery 206 from the battery voltage tester 200 since prolonged drainage of current through the battery voltage tester 200 greatly shortens the lifetime of the battery 206. Thus controller 260 connects battery 206 to the battery voltage tester 200 using switch 264 only when the battery is tested, thus preventing the tester from overloading the battery 206.

While the invention has been described with reference to a particular embodiment, it will be understood that the embodiment is illustrative and that the invention scope is not so limited. Many modifications, variations, additions and improvements to the described embodiment are possible. For example, the low battery detector is useful in many applications, including electronic key chips, battery powered cordless telephones and many other cost-driven battery powered equipment applications. In addition, the comparator 250 may be any suitable comparator circuit, such as a differential amplifier. Furthermore, the potential divider network may be a network of other elements in addition to resistive elements, such as capacitive, inductive or mixed networks. Furthermore, the impedances and relative impedances of the potential divider network elements may have numerous values in addition to the values depicted in the illustrative embodiment.

The switches in a particular embodiment may be implemented by transistors, Schottky diodes, field-effect transistors, anticapacitance switches, commutation switches, glow switches, flip-flops, muting switches, single-pole switches, time switches, transmit-receive switches, vacuum switches, NMOS or CMOS transmission gates, gated bidirectional switches, triacs, silicon-controlled rectifiers and the like.

In addition, the sampling controller may have the form of numerous embodiments including, but not limited to, processors, logic circuits, external and internal switches, buttons and actuators.

These and other variations, modifications, additions and improvements may fall within the scope of the invention as defined in the appended claims.

We claim:

1. An apparatus for testing a battery, the battery being unloaded at a first time and under load at a second time, the apparatus comprising:
   a potential divider coupled to the battery and having a first tap and a second tap;
   a potential sampler having a switch coupled to the second tap and a storage element coupled to the switch;
   a comparator having a first input coupled to the storage element and a second input coupled to the first tap and having an output; and
   a controller coupled to the switch to control the switch at the first time to store a first ratiometric portion of the unloaded battery voltage on the storage element and to control the switch at the second time to apply the first ratiometric portion of the unloaded battery voltage to the comparator first input, a second ratiometric portion of the loaded battery voltage being applied to the comparator second input so that the comparator output designates a battery test result.

2. An apparatus as in claim 1, wherein the switch is a second switch, the apparatus further comprising:
   a first switch coupled between the potential divider and the battery and receiving a control input of the controller, wherein the controller is coupled to the first switch to disconnect the potential divider from the battery when battery test is complete and to connect the potential divider to the battery to test the battery.

3. An apparatus as in claim 1, wherein the controller is coupled to the load to isolate the load from the battery at the first time and to apply the load to the battery at the second time.

4. An apparatus as in claim 1, wherein the storage element is a capacitor.

5. An apparatus as in claim 1, wherein the first and second switches are CMOS transmission gates.

6. An apparatus as in claim 1, further comprising a halt switch connected between the battery and the potential divider, the controller being coupled to the halt switch to control the halt switch to engage and disengage the potential divider from the battery.

7. An apparatus as in claim 6, wherein the halt switch is a CMOS transmission gate.

8. A battery tester comprising:
   a potential sampler coupled to the battery including
      a first switch selectably coupling the battery to a load;
      a potential divider network coupled to the battery at a battery terminal and having a first tap and a second tap,
      a storage element switchably coupled to the first tap by a second switch, and
      a sampling controller coupled to the first and second switches to measure a first ratiometric portion of the unloaded battery voltage by disconnecting the battery from the load and connecting the storage element to the first tap and to measure a second ratiometric portion of the unloaded battery voltage by connecting the battery to the load and disconnecting the storage element from the first tap; and
   a comparator having a first input terminal coupled to the storage element and a second input terminal coupled to the second tap to compare the first ratiometric portion of the unloaded battery voltage to the second ratiometric portion of the loaded battery voltage and having an output designating a battery test result.

9. A battery tester as in claim 8, wherein the storage element is a capacitor.

10. A battery tester as in claim 8, wherein the first and second switches are CMOS transmission gates.

11. A low battery detector, comprising:
a voltage divider including
a first resistor coupled to a battery voltage terminal,
a second resistor coupled to the first resistor at a first node, and
a third resistor coupled to the second resistor at a second node and coupled to a reference terminal;
a sample switch coupled to the second node;
a capacitor coupled to the sample switch at a third node and coupled to the reference terminal;
a comparator having a first differential input coupled to the first node, a second differential input coupled to the third node and an output; and
a controller coupled to the sample switch to selectively couple the capacitor to the second node.

12. A low battery detector as in claim 11 wherein the resistance of the first resistor is approximately four times the resistance of the second resistor and the resistance of the third resistor is approximately three times the resistance of the second resistor.

13. A low battery detector as in claim 11, wherein the sample switch is a CMOS transmission gate.

14. A low battery detector as in claim 11, wherein the battery is unloaded at a first time and under load at a second time, the detector further comprising:
a halt switch connected between the battery and the first resistor, wherein
the controller is coupled to the halt switch to control the halt switch to engage and disengage the potential divider from the battery and the controller is coupled to the sample switch to control the sample switch at a first time to store a first ratiometric portion of the unloaded battery voltage on the storage element and to control the sample switch at the second time to apply the first ratiometric portion of the unloaded battery voltage to the comparator first differential input, a second ratiometric portion of the loaded battery voltage being applied to the comparator second differential input so that the comparator output designates a battery test result.

15. A method for testing a battery comprising the steps of:
dividing an unloaded battery potential to furnish a first ratiometric portion of the unloaded battery voltage at a first tap of a potential divider;
switching the unloaded battery voltage at the first tap onto a storage element;
storing the unloaded battery voltage;
unswitching the loaded battery voltage at the first tap from the storage element;
applying a load to the battery;
dividing the loaded battery potential to furnish a second ratiometric portion of the loaded battery voltage at a second tap of the potential divider;
comparing the stored first ratiometric portion of the unloaded battery voltage to the second ratiometric portion of the loaded battery voltage; and
indicating the result of the comparison.

16. A method as in claim 15 further comprising the steps of:
electrically isolating the battery from the potential divider when the result of the comparison has been indicated;
receiving a request for a battery test; and
electrically connecting the battery to the potential divider in response to the test request.

* * * * *